(12) United States Patent
Veerasamy et al.

(10) Patent No.: US 6,472,017 B2
(45) Date of Patent: *Oct. 29, 2002

(54) METHOD OF MAKING COATED ARTICLE INCLUDING DIAMOND-LIKE CARBON (DLC) AND FAS

(75) Inventors: Vijayen S. Veerasamy, Farmington Hills, MI (US); Rudolph Hugo Petrmichl, Ann Arbor, MI (US); Scott V. Thomsen, Milford, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/877,099

(22) Filed: Jun. 11, 2001

(65) Prior Publication Data

US 2001/0053412 A1 Dec. 20, 2001

Related U.S. Application Data

(60) Division of application No. 09/627,441, filed on Jul. 28, 2000, now Pat. No. 6,280,834, which is a continuation-in-part of application No. 09/617,815, filed on Jul. 17, 2000, and a continuation-in-part of application No. 09/583,862, filed on Jun. 1, 2000, and a continuation-in-part of application No. 09/442,805, filed on Nov. 18, 1999, said application No. 09/617,815, is a continuation-in-part of application No. 09/303,548, filed on May 3, 1999, now Pat. No. 6,261,693.

(51) Int. Cl.$^7$ .............................................. C23C 16/26
(52) U.S. Cl. ................... 427/249.7; 427/376.1
(58) Field of Search .......................... 427/249.7, 249.8, 427/372.2, 376.1

(56) References Cited

U.S. PATENT DOCUMENTS

| | | |
|---|---|---|
| 3,959,577 A | 5/1976 | Frink |
| 4,060,660 A | 11/1977 | Carlson et al. |
| 4,263,350 A | 4/1981 | Valimont |
| 4,400,410 A | 8/1983 | Green et al. |
| 4,495,263 A | 1/1985 | Vandervalk |
| RE32,272 E | 10/1986 | Funaki et al. |
| 4,666,802 A | 5/1987 | Hung et al. |
| 4,746,538 A | 5/1988 | Mackowski |
| 4,777,090 A | 10/1988 | Cvshinsky et al. |
| 4,816,291 A | 3/1989 | Desphandey et al. |
| 4,877,677 A | 10/1989 | Hirochi et al. |
| 4,935,303 A | 6/1990 | Ikoma et al. |
| 4,965,156 A | 10/1990 | Hotomi et al. |
| 5,000,831 A | 3/1991 | Osawa et al. |
| 5,098,737 A | 3/1992 | Collins et al. |

(List continued on next page.)

FOREIGN PATENT DOCUMENTS

| | | |
|---|---|---|
| WO | WO 04/12680 | 6/1994 |
| WO | WO 98/45847 | 10/1998 |

OTHER PUBLICATIONS

US 4,960,645, 10/1990, Lingle et al. (withdrawn)
"6001 Chemical Abstracts", Columbus, Ohio (1996) 1pg.

(List continued on next page.)

*Primary Examiner*—Bret Chen
(74) *Attorney, Agent, or Firm*—Nixon & Vanderhye P.C.

(57) ABSTRACT

A substrate is coated with a hydrophobic coating system including diamond-like carbon (DLC) and at least one fluoro-alkyl silane (FAS) compound. In certain embodiments, the coating system includes an FAS inclusive layer provided over at least one DLC inclusive layer in order to increase the initial contact angle of the coated article. At least the FAS inclusive layer may be heated (i.e., thermally cured) to an extent sufficient to at least one of: (a) improve the initial contact angle θ of the resulting coated article, (b) render the hydrophobic nature of the resulting coated article more stable when exposed to solution(s)/material(s) such as hexane and/or isopropyl alcohol, and/or (c) improve bonding characteristics of the FAS inclusive layer within itself and/or between the FAS inclusive layer and a layer immediately beneath it.

17 Claims, 9 Drawing Sheets

U.S. PATENT DOCUMENTS

| | | | |
|---|---|---|---|
| 5,122,249 A | 6/1992 | Niemann et al. | |
| 5,135,808 A | 8/1992 | Kimock et al. | |
| 5,143,963 A | 9/1992 | Sterling et al. | |
| 5,188,887 A | 2/1993 | Linge et al. | |
| 5,190,807 A | 3/1993 | Kimock et al. | |
| 5,214,008 A | 5/1993 | Beckwith et al. | |
| 5,229,194 A | 7/1993 | Lingle et al. | |
| 5,240,886 A | 8/1993 | Gulotta et al. | |
| 5,242,560 A | 9/1993 | Lingle et al. | |
| 5,250,322 A | 10/1993 | Takahashi et al. | |
| 5,268,217 A | 12/1993 | Kimock et al. | |
| 5,294,252 A | 3/1994 | Gun | |
| 5,298,048 A | 3/1994 | Lingle et al. | |
| 5,328,768 A | 7/1994 | Goodwin | |
| 5,344,718 A | 9/1994 | Hartig et al. | |
| 5,352,493 A | 10/1994 | Dorfman et al. | |
| 5,376,455 A | 12/1994 | Hartig et al. | |
| 5,378,527 A | 1/1995 | Nakanishi et al. | |
| 5,385,872 A | 1/1995 | Gulotta et al. | |
| 5,401,316 A | 3/1995 | Shiraishi et al. | |
| 5,415,297 A | 5/1995 | Hirayama et al. | |
| 5,415,927 A | 5/1995 | Hirayama et al. | |
| 5,425,861 A | 6/1995 | Hartig et al. | |
| 5,425,983 A | 6/1995 | Propst et al. | |
| 5,435,900 A | 7/1995 | Gorokhovsky | |
| 5,437,894 A | 8/1995 | Ogawa et al. | |
| 5,455,081 A | 10/1995 | Okada et al. | |
| 5,470,661 A | 11/1995 | Bailey et al. | |
| 5,474,816 A | 12/1995 | Falabella | |
| 5,506,038 A | 4/1996 | Knapp et al. | |
| 5,507,987 A | 4/1996 | Windischmann | |
| 5,508,092 A | 4/1996 | Kimock et al. | |
| 5,508,368 A | 4/1996 | Knapp et al. | |
| 5,510,186 A | 4/1996 | Suizbach | |
| 5,514,476 A | 5/1996 | Hartig et al. | |
| 5,518,780 A | 5/1996 | Tamor et al. | |
| 5,527,559 A | 6/1996 | Simpson | |
| 5,527,596 A | 6/1996 | Kimock et al. | |
| 5,547,714 A | 8/1996 | Huck et al. | |
| 5,557,462 A | 9/1996 | Hartig et al. | |
| 5,580,605 A | 12/1996 | Ogawa et al. | |
| 5,612,262 A | 3/1997 | Kloss et al. | |
| 5,614,574 A | 3/1997 | Sheth | |
| 5,616,179 A | 4/1997 | Baldwin et al. | |
| 5,620,745 A | 4/1997 | Simpson | |
| 5,624,718 A | 4/1997 | Dearnaley | |
| 5,629,532 A | 5/1997 | Myrick | |
| 5,635,245 A | 6/1997 | Kimock et al. | |
| 5,635,258 A | 6/1997 | Chen et al. | |
| 5,637,353 A | 6/1997 | Kimock et al. | |
| 5,643,423 A | 7/1997 | Kimock et al. | |
| 5,653,812 A | 8/1997 | Petrmichl et al. | |
| 5,679,269 A | 10/1997 | Cohen et al. | |
| 5,679,446 A | 10/1997 | Windischmann | |
| 5,688,585 A | 11/1997 | Lingle et al. | |
| 5,688,864 A | 11/1997 | Goodwin | |
| 5,718,976 A | 2/1998 | Dorfman et al. | |
| 5,731,046 A | 3/1998 | Mistry et al. | |
| 5,736,476 A | 4/1998 | Watzke et al. | |
| 5,747,118 A | 5/1998 | Bunshah et al. | |
| 5,762,715 A | 6/1998 | Patten, Jr. et al. | |
| 5,770,321 A | 6/1998 | Hartig et al. | |
| 5,776,553 A | 7/1998 | Jaffe et al. | |
| 5,776,600 A | 7/1998 | Katayama et al. | |
| 5,776,603 A | 7/1998 | Zagdoun et al. | |
| 5,776,612 A | 7/1998 | Fisher | |
| 5,776,845 A | 7/1998 | Boulos et al. | |
| 5,776,846 A | 7/1998 | Sakaguchi et al. | |
| 5,783,260 A | 7/1998 | Kato et al. | |
| 5,783,309 A | 7/1998 | Faure et al. | |
| 5,792,254 A | 8/1998 | Windischmann | |
| 5,795,648 A | 8/1998 | Goel et al. | |
| 5,798,139 A | 8/1998 | Nagashima et al. | |
| 5,800,918 A | 9/1998 | Chartier et al. | |
| 5,800,933 A | 9/1998 | Hartig et al. | |
| 5,824,374 A | 10/1998 | Bradley, Jr. et al. | |
| 5,830,332 A | 11/1998 | Babich et al. | |
| 5,830,812 A | 11/1998 | Shelestak et al. | |
| 5,837,108 A | 11/1998 | Lingle et al. | |
| 5,837,357 A | 11/1998 | Matsuo et al. | |
| 5,844,225 A | 12/1998 | Kimock et al. | |
| 5,846,613 A | 12/1998 | Neuville | |
| 5,846,649 A | 12/1998 | Knapp et al. | |
| 5,849,228 A | 12/1998 | Patton, Jr. et al. | |
| 5,849,413 A | 12/1998 | Zhu et al. | |
| 5,851,940 A | 12/1998 | Boulos et al. | |
| 5,855,641 A | 1/1999 | Taniguchi | |
| 5,856,016 A | 1/1999 | Takahashi et al. | |
| 5,858,477 A | 1/1999 | Veerasamy et al. | |
| 5,858,894 A | 1/1999 | Nagashima et al. | |
| 5,858,896 A | 1/1999 | Nagashima et al. | |
| 5,863,605 A | 1/1999 | Bak-Boychuk et al. | |
| 5,873,921 A | 2/1999 | Hiroth et al. | |
| 5,876,753 A | 3/1999 | Timmons et al. | |
| 5,877,103 A | 3/1999 | Dupont et al. | |
| 5,879,775 A | 3/1999 | Walter et al. | |
| 5,880,552 A | 3/1999 | McGill et al. | |
| 5,888,593 A | 3/1999 | Petrmichl et al. | |
| 5,900,342 A | 5/1999 | Visser et al. | |
| 5,939,140 A | 8/1999 | Jang et al. | |
| 5,958,601 A | 9/1999 | Salsman | |
| 5,958,996 A | 9/1999 | Egitto et al. | |
| 5,965,216 A | 10/1999 | Neuberger et al. | |
| 5,965,629 A | 10/1999 | Jung et al. | |
| 5,989,693 A | 11/1999 | Yamasaki et al. | |
| 5,997,943 A | 12/1999 | Azzopardi et al. | |
| 6,001,431 A | 12/1999 | Itoh et al. | |
| 6,002,208 A | 12/1999 | Maishev et al. | |
| 6,046,758 A | 4/2000 | Brown et al. | |
| 6,261,424 B1 | 7/2001 | Goncharenko et al. | |

OTHER PUBLICATIONS

"Highly Tetrahedral, Diamond–Like Amorphous Hydrogenated Carbon Prepared From a Plasma Beam Source", Sattel et al., Published Feb. 1994 pp. 2797–2799.

"Deposition of Carbon Films by a Filtered Cathodic Arc", Kuhn et al., Jan. 1993, pp. 1350–1354.

"Electronic Density of States in Highly Tetrahedral Amorphous Carbon", Veerasamy et al., Aug. 1993, pp. 319–326.

"Preparation and Properties of Highly Tetrahedral Hydrogenated Amorphous Carbon", Weiler et al., Jan. 1996, pp. 1594–1607.

"Optical and Electronic Properties of Amorphous Diamond", Veerasamy et al., Feb. 1993, pp. 782–787.

"IBM Tech Bulletin", vol. 36, No. 3 (1993) 1pg.

"IBM Tech Bulletin", vol. 36, No. 1 (1993) 1pg.

"Tetrahedral Amorphous Carbon Deposition, Characterisation and Electrode Properties" by Veerasamy, Univ. of Cambridge, Jul., 1994.

"ANSI Z26.1", Society of Automotive Engineers, American National Standards Institute, Inc., 1977.

| Cycle # | Sputter time Seconds | Depth (SiO2) Å | Atomic Concentration % | | | SUM |
|---|---|---|---|---|---|---|
| | | | C | O | Si | |
| 1 | 0 | 0 | 92.5 | 5.7 | 1.7 | 100 |
| 2 | 16 | 6 | 96.4 | 1.8 | 1.9 | 100 |
| 3 | 32 | 12 | 96.2 | 1.9 | 1.9 | 100 |
| 4 | 62 | 23 | 95.8 | 1.4 | 2.8 | 100 |
| 5 | 92 | 34 | 95.9 | 1.2 | 2.9 | 100 |
| 6 | 122 | 45 | 94.7 | 1.7 | 3.6 | 100 |
| 7 | 222 | 82 | 89.6 | 2.7 | 7.7 | 100 |
| 8 | 322 | 119 | 83.1 | 3.3 | 13.6 | 100 |
| 9 | 422 | 156 | 76.6 | 4.4 | 19.0 | 100 |
| 10 | 522 | 193 | 70.5 | 4.4 | 25.2 | 100 |
| 11 | 622 | 230 | 68.1 | 4.7 | 27.2 | 100 |
| 12 | 722 | 267 | 66.8 | 4.7 | 28.5 | 100 |
| 13 | 822 | 304 | 62.5 | 7.1 | 30.5 | 100 |
| 14 | 922 | 341 | 45.1 | 23.1 | 31.7 | 100 |
| 15 | 1022 | 378 | 11.1 | 54.0 | 34.9 | 100 |
| 16 | 1122 | 415 | 0 | 65.9 | 34.1 | 100 |
| 17 | 1222 | 452 | 0 | 66.1 | 33.9 | 100 |
| 18 | 1322 | 489 | 0 | 65.9 | 34.1 | 100 |
| 19 | 1422 | 526 | 0 | 66.1 | 33.9 | 100 |

FIG. 8

| Cycle # | Sputter time Seconds | Depth (SiO2) Å | Atomic Concentration % | | | SUM |
|---|---|---|---|---|---|---|
| | | | C | O | Si | |
| 1 | 0 | 0 | 72.2 | 17.7 | 10.0 | 100 |
| 2 | 16 | 8 | 83.1 | 7.2 | 9.7 | 100 |
| 3 | 32 | 15 | 82.3 | 4.1 | 13.5 | 100 |
| 4 | 48 | 23 | 81.2 | 4.9 | 13.9 | 100 |
| 5 | 64 | 31 | 79.4 | 5.2 | 15.4 | 100 |
| 6 | 80 | 38 | 75.9 | 5.6 | 18.5 | 100 |
| 7 | 96 | 46 | 74.0 | 8.5 | 17.4 | 100 |
| 8 | 112 | 54 | 68.9 | 10.8 | 20.2 | 100 |
| 9 | 128 | 61 | 64.2 | 13.9 | 22.0 | 100 |
| 10 | 144 | 69 | 58.7 | 17.8 | 23.5 | 100 |
| 11 | 160 | 77 | 49.4 | 23.2 | 27.4 | 100 |

FIG. 9

METHOD OF MAKING COATED ARTICLE INCLUDING DIAMOND-LIKE CARBON (DLC) AND FAS

This application is a division of application Ser. No. 09/627,441, filed Jul. 28, 2000, now U.S. Pat. No. 6,280,834, which is a continuation-in-part of Ser. No. 09/617,815, filed Jul. 17, 2000; which is a continuation-in-part of Ser. No. 09/303,548, filed May 3, 1999 now U.S. Pat. No. 6,261,693, and a continuation-in-part of Ser. No. 09/442,805, filed Nov. 18, 1999 and a continuation-in-part of Ser. No. 09/583,862, filed Jun. 1, 2000, the entire content of which is hereby incorporated by reference in this application.

This invention relates to a method of thermally curing a hydrophobic coating system including diamond-like carbon (DLC) and at least one fluoro-alkyl silane (FAS) compound provided on (directly or indirectly) a substrate of glass, plastic, ceramic, or the like, and a resulting coated article. The coating system may include one or more layers, and the DLC portion of the coating may be deposited on the substrate utilizing plasma ion beam deposition in certain embodiments.

BACKGROUND OF THE INVENTION

Conventional substrates (e.g., glass) are susceptible to retaining water on their surfaces in many different environments, e.g., when used as automotive windows (e.g. backlites, side windows, and/or windshields) or as architectural/residential windows. When water is retained or collects on automotive windows, the water may freeze (i.e. forming ice). Additionally, the more water retained on a windshield, the higher power wiper motor(s) and/or wiper blade(s) required.

Thus, there exists a need in the art for a coated article (e.g. coated glass, ceramic or plastic substrate) that can repel water and/or dirt, and a method of making the same.

It is known to provide diamond like carbon (DLC) coatings on glass. U.S. Pat. No. 5,637,353, for example, states that DLC may be applied on glass. Unfortunately, the DLC of the '353 patent would not be an efficient hydrophobic coating.

U.S. Pat. No. 5,250,322 to Takahashi et al., discloses a water-repellant coating including FAS on a glass substrate. Unfortunately, the water-repellant coatings of the '322 patent may not be durable enough for certain applications (e.g., it may be prone to scratching, breaking down, etc. in automotive and/or other harsh environments).

In view of the above, it is apparent that there further exists a need in the art for a durable protective hydrophobic coating system that is somewhat resistant to scratching, damage, or the like.

It is a purpose of different embodiments of this invention to fulfill any or all of the above described needs in the art, and/or other needs which will become apparent to the skilled artisan once given the following disclosure.

SUMMARY OF THE INVENTION

Surprisingly, it has been found that by heating a fluoro-alkyl silane (FAS) compound inclusive layer applied on a diamond-like carbon (DLC) inclusive layer, the bond between the two layers may be strengthened and/or contact angle characteristics of the resulting coated article may be improved.

An object of this invention is to provide a method of thermally curing a hydrophobic coating system including diamond-like carbon (DLC) and at least one fluoro-alkyl silane (FAS) compound provided on (directly or indirectly) a substrate of glass, plastic, ceramic, or the like, and a resulting coated article.

Another object of this invention is to provide a method of thermally curing a hydrophobic coating system including diamond-like carbon (DLC) and at least one fluoro-alkyl silane (FAS) compound provided on (directly or indirectly) a substrate wherein the coating system is heated during the curing process to an extent sufficient to increase an initial contact angle of the resulting coated article and/or increase contact angle stability of the resulting coated article upon its exposure to material(s) such as hexane and/or isopropyl alcohol.

Another object of this invention is to provide a method of thermally curing a hydrophobic coating system including diamond-like carbon (DLC) and at least one fluoro-alkyl silane (FAS) compound provided on (directly or indirectly) a substrate, wherein the coating system is heated during the curing process to an extent sufficient to reduce the amount that the resulting article's contact angle will go down upon exposure to material(s) such as hexane and/or isopropyl alcohol.

Another object of this invention is to provide a method of thermally curing a hydrophobic coating system including diamond-like carbon (DLC) and at least one fluoro-alkyl silane (FAS) compound provided on (directly or indirectly) a substrate, wherein the coating system is heated during the curing process to an extent sufficient to improve bonding of the FAS inclusive layer to an underlying DLC inclusive layer.

An object of this invention is to provide a durable coated article that can shed or repel water (e.g. automotive windshield, automotive backlite, automotive side window, architectural window, bathroom shower glass, residential window, bathroom shower door, coated ceramic article/tile, etc.).

Another object of this invention is to provide a hydrophobic coating system including one or more diamond-like carbon (DLC) inclusive layers.

Another object of this invention is to provide a hydrophobic coating system including each of DLC and FAS, the DLC being provided for durability purposes and the FAS for increasing the contact angle of the coating system.

Yet another object of this invention, in embodiments where a hydrophobic coating system includes multiple DLC inclusive layers and at least one FAS layer, is to form (e.g., via ion beam deposition techniques) a first underlying DLC inclusive layer using a first precursor or feedstock gas and a second DLC inclusive layer over the first underlying DLC inclusive layer using a second precursor or feedstock gas. The FAS inclusive layer may then be applied over the DLC layers in any suitable manner and then thermally cured in a manner so as to improve bonding of the FAS inclusive layer to the DLC inclusive layer and/or to improve contact angle characteristics of the resulting coated article. In certain embodiments, the first underlying DLC inclusive layer may function as an anchoring and/or barrier layer while the second or overlying DLC inclusive layer may be more scratch resistant (i.e., harder) and/or more dense so as to improve the coated article's durability and/or scratch resistance.

Another object of this invention is to provide a coated substrate, wherein a coating system includes $sp^3$ carbon-carbon bonds and FAS, and has a wettability W with regard to water of less than or equal to about 23 mN/m, more preferably less than or equal to about 21 mN/m, even more preferably less than or equal to about 20 mN/m, and in most preferred embodiments less than or equal to about 19 mN/meter. This can also be explained or measured in Joules per unit area (mJ/m$^2$).

Another object of this invention is to provide a coated substrate, wherein a coating system includes sp$_3$ carbon-carbon bonds and thermally cured FAS, the coating system having a surface energy $\gamma_C$ (on the surface of the coated article) of less than or equal to about 20.2 mN/m, more preferably less than or equal to about 19.5 mN/m, and most preferably less than or equal to about 18 mN/m.

Another object of this invention is to provide a coated substrate, wherein a DLC and FAS inclusive coating system has an initial (i.e. prior to being exposed to environmental tests, rubbing tests, acid tests, UV tests, or the like) water contact angle θ of at least about 80 degrees, more preferably of at least about 100 degrees, even more preferably of at least about 110 degrees, and most preferably of at least about 125 degrees.

Another object of this invention is to provide a coated glass article wherein a DLC and FAS inclusive coating system protects the glass from acids such as HF, nitric, and sodium hydroxide.

Another object of this invention is to provide a coating system for a substrate that is abrasion resistant.

Another object of this invention is to manufacture a coated article having hydrophobic qualities wherein the temperature of an underlying glass substrate may be less than about 200° C., preferably less than about 150° C., most preferably less than about 80° C., during the deposition of a DLC and FAS inclusive coating system. This reduces graphitization during the deposition process, as well as reduces detempering and/or damage to low-E and/or IR-reflective coatings already on the substrate in certain embodiments.

Yet another object of this invention is to fulfill any and/or all of the aforesaid objects and/or needs.

This invention fulfills any and/or all of the aforesaid objects and/or needs by providing a method of making a coated article comprising the steps of:

providing a substrate;
forming a coating system on the substrate in a manner such that the coating system includes each of diamond-like carbon (DLC) and at least one fluoro-alkyl silane (FAS) compound; and
heating at least an FAS compound portion of the coating system to a temperature and for a period of time sufficient to increase an initial contact angle θ of the resulting coated article.

This invention further fulfills any and/or all of the above described needs by providing a method of making a coated article comprising the steps of:

providing a substrate;
forming a coating system on the substrate in a manner such that the coating system includes each of diamond-like carbon (DLC) and at least one fluoro-alkyl silane (FAS) compound; and
heating at least an FAS compound portion of the coating system to a temperature of from about 50 to 300 degrees C.

This invention further fulfills any and/or all of the above described needs and/or objects by providing a method of making a coated article comprising the steps of:

providing a substrate;
forming a coating system on the substrate in a manner such that the coating system includes at least one diamond-like carbon (DLC) inclusive layer and at least one fluoro-alkyl silane (FAS) inclusive layer; and
heating at least the FAS inclusive layer of the coating system to a temperature and for a period of time sufficient to improve contact angle θ stability of the resulting coated article.

This invention will now be described with respect to certain embodiments thereof, along with reference to the accompanying illustrations.

IN THE DRAWINGS

FIG. 8 is a chart illustrating the atomic amounts of carbon, oxygen, and silicon (relative only to one another) at different thicknesses of a sample coating system in accordance with the FIG. 1 embodiment of this invention, but without the overlying FAS inclusive layer.

FIG. 9 is a chart illustrating the atomic amounts of carbon, oxygen, and silicon (relative only to one another) at different thicknesses of the FAS portion of a sample coating system in accordance with the FIG. 1 embodiment of this invention; so FIGS. 8–9 can be used together to illustrate a complete coating system including both DLC and FAS inclusive layers of the FIG. 1 embodiment.

DETAILED DESCRIPTION OF CERTAIN EMBODIMENTS OF THIS INVENTION

Figure 1A:
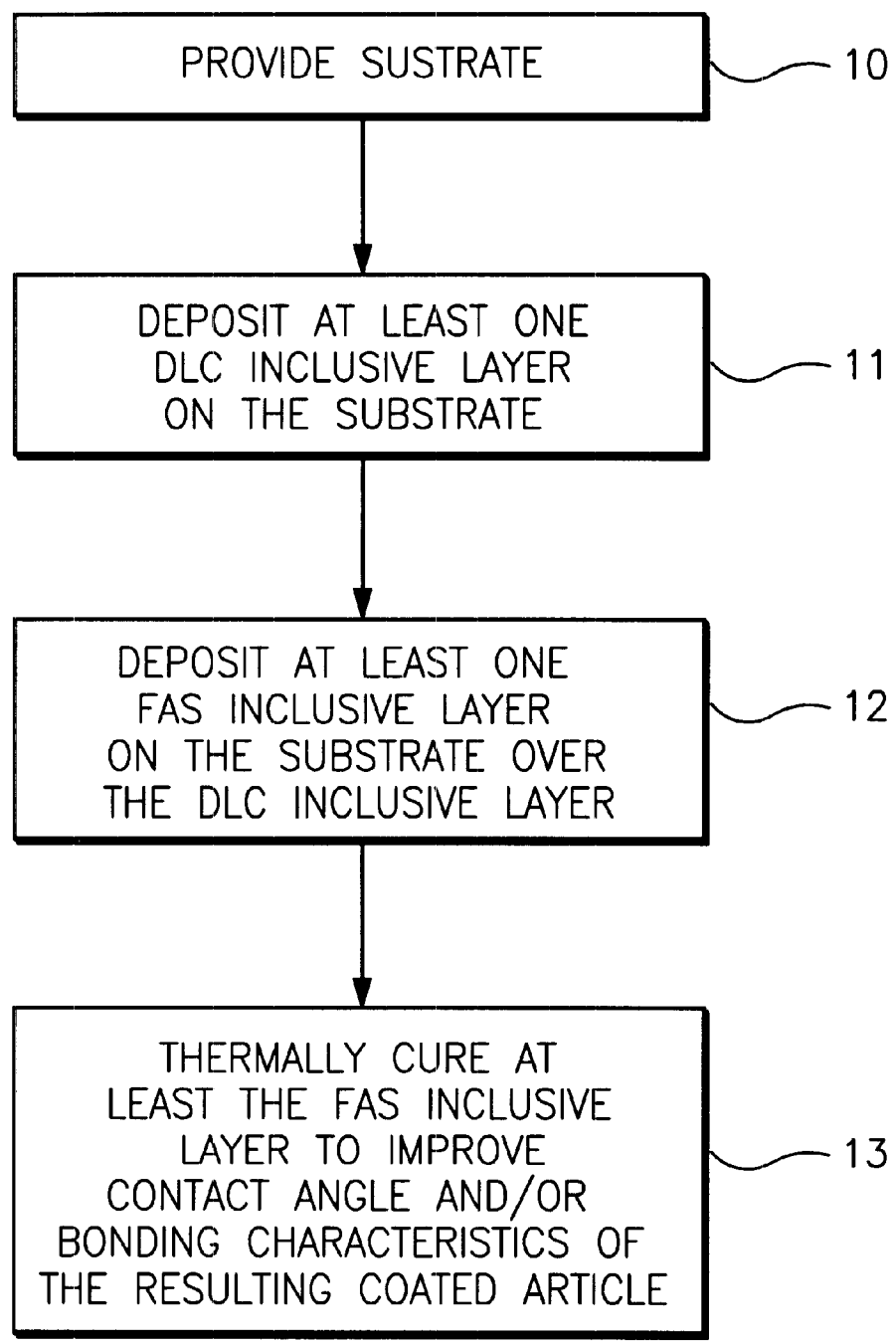
FIG. 1(a) is a flowchart illustrating certain steps taken according to an exemplary embodiment of this invention.

Referring now more particularly to the accompanying drawings in which like reference numerals indicate like elements throughout the accompanying views.

An object of this invention is to provide a method of making an article having a durable hydrophobic coating thereon. As will be explained in more detail below, the higher the contact angle θ the more hydrophobic a particular coating or coated article. Thus, it is desirable to have a high contact angle θ if a hydrophobic type product is wanted.

The parent application filed Jul. 17, 2000 discloses a hydrophobic coating on an article, the coating including among other things at least one diamond-like carbon (DLC) inclusive layer as well as at least one fluoro-alkyl silane (FAS) compound inclusive layer. Surprisingly, it has been found that by heating at least the FAS compound inclusive layer (the FAS inclusive layer may be heated primarily by itself after its deposition, or alternatively the entire coated article including the FAS inclusive layer may be heated) applied on (directly or indirectly) a diamond-like carbon (DLC) inclusive layer, the bond between the two layers may be strengthened and/or contact angle characteristics of the resulting coated article may be improved.

For example, without heating (i.e., thermal curing) of at least the FAS inclusive layer the resulting coated article may have an initial contact angle θ of about 115 degrees. However, when at least the FAS inclusive layer (preferably the entire coated substrate including the FAS inclusive layer) is heated then the resulting coated article may have an initial contact angle θ of about 120 degrees. Note the increase in initial contact angle due to the heating or thermal curing.

Also, this heating or thermal curing may also result in increased stability of the contact angle θ of the resulting coated article upon the article's exposure to solutions/materials such as hexane and/or isopropyl alcohol (e.g., if dipped in either hexane or isopropyl alcohol for about 5 seconds, and then wiped dry). For example, absent any heating or thermal curing of the FAS inclusive layer, the contact angle θ of the resulting coated article may drop from about 115 to 100 degrees upon dipping of the article in hexane for about 5 seconds. However, when this thermal curing or heating is performed, the contact angle θ of the resulting coated article may only drop from about 120 to about 110–116 degrees. Note that there is less of a drop/reduction in contact angle θ when the heating or thermal curing step is performed.

Additionally, it has been found that heating of the article including the DLC and FAS inclusive layers may tend to increase the bonding strength between the DLC inclusive layer and FAS inclusive layer in certain embodiments.

It is not clear to the instant inventors why the aforesaid advantages result from the heating of at least the FAS inclusive layer after the coating system has been provided on the substrate. However, it is suspected that such heating may induce cross linking in the FAS inclusive layer or between the FAS and DLC inclusive layers (e.g., alcohol group may react to achieve Si—O—Si bonds due to heating).

FIG. 1($a$) is a flowchart illustrating certain steps taken in the manufacture of a hydrophobic coated article according to an embodiment of this invention. A substrate (e.g., glass, plastic, or ceramic substrate) is provided at step 10. At least one DLC inclusive layer is deposited on the substrate at step 11. This DLC inclusive layer(s) may be deposited either directly on the surface of the substrate or alternatively may be deposited on the substrate with another layer(s) located between the DLC inclusive layer(s) and the substrate. Following formation of the DLC inclusive layer(s), an FAS compound inclusive layer is deposited on the substrate in step 12. The FAS inclusive layer is preferably deposited directly on the upper surface of a DLC inclusive layer in certain embodiments of this invention, but alternatively other layer(s) may be located between the DLC inclusive layer(s) and the FAS inclusive layer.

Still referring to FIG. 1($a$), after the DLC and FAS inclusive layers have been deposited on the substrate, the entire coated article (or alternatively only the FAS inclusive layer) is subjected to heating for curing purposes in step 13. The heating may take place in any suitable oven or furnace, or alternatively may be implemented by an IR or any other type of localized heating device. This heating may be at a temperature of from about 50 to 300 degrees C., more preferably at a temperature of from about 70 to 200 degrees C., and even more preferably at a temperature of from about 70–100 degrees C. However, it is noted that as the heating time goes up, the required temperature goes down. Thus, for purposes of example only, the heating may be conducted at about 80 degrees C. for about 60 minutes (1 hour). Alternatively, the heating may be conducted at about 250 degrees C. for about 5 minutes, or at about 150 degrees C. for about 20 minutes. The time which the coated article is subjected to heating may range from about 20 seconds to 2 hours in certain embodiments of this invention, more preferably from about one (1) minute to one (1) hour, depending on the temperature used. In preferred embodiments of this invention, at least the FAS inclusive layer (and preferably the entire coated article) is heated at a temperature and for a period of time sufficient to achieve one or more of the advantages discussed above.

FIG. 1($b$) is a side cross sectional view of a coated article according to an embodiment of this invention, wherein a diamond-like carbon (DLC) and fluoro-alkyl silane (FAS) inclusive coating system 5 including at least three layers 2, 3 and 6 is provided on substrate 1. Substrate 1 may be of glass, plastic, ceramic, or the like. In certain embodiments, each of layers 2 and 3 of the coating system 5 includes at least some amount of highly tetrahedral amorphous carbon (ta-C). Highly tetrahedral amorphous carbon (ta-C) forms $sp^3$ carbon-carbon bonds, and is a special form of diamond-like carbon (DLC). FAS inclusive layer 6 is then applied over layers 2, 3. Coating system 5 functions in a hydrophobic manner (i.e., it is characterized by high water contact angles θ and/or low surface energies as described below), and optionally may be characterized by low tilt angle(s) β in certain embodiments. In general, the DLC inclusive layer(s) 2 and/or 3 provide durability and/or hydrophobicity, while FAS inclusive layer 6 functions to even further increase the contact angle θ of the coating system 5.

It is surmised that the surface of DLC inclusive layer 3 includes highly reactive dangling bonds immediately after its formation/deposition, and that the application of FAS inclusive layer 6 onto the surface of layer 3 shortly after layer 3's formation enables tight binding and/or anchoring of FAS inclusive layer 6 to the surface of layer 3. This results in increased contact angle θ (improved hydrophobicity) and a durable coating system 5. In certain embodiments of this invention, it has been found that FAS inclusive layer 6 bonds more completely to DLC inclusive layer 3 when FAS layer 6 is applied on the upper surface of layer 3 within one hour after layer 3 is formed, more preferably within thirty minutes after layer 3 is formed, and most preferably within twenty minutes after layer 3 is formed. Thus, a more durable coating system results when FAS inclusive layer 6 is applied on DLC inclusive layer 3 shortly after layer 3 is formed. At least FAS layer 6 is heated as discussed above in order to achieve one or more of the advantages potentially associated with such heating/curing.

Overlying layer 6 may be substantially all FAS, or only partially FAS in different embodiments of this invention.

Layer 6 preferably includes at least one compound having an FAS group. Generally speaking, FAS compounds generally comprise silicon atoms bonded to four chemical groups. One or more of these groups contains fluorine and carbon atoms, and the remaining group(s) attached to the silicon atoms are typically alkyl (hydrocarbon), alkoxy (hydrocarbon attached to oxygen), or halide (e.g., chlorine) group(s). Exemplary types of FAS for use in layer 6 include $CF_3(CH_2)_2Si(OCH_3)_3$ [i.e., 3,3,3 trifluoropropyl)trimethoxysilane]; $CF_3(CF_2)_5(CH_2)_2Si(OCH_2CH_3)_3$ [i.e., tridecafluoro-1,1,2,2-tetrahydrooctyl-1-triethoxysilane]; $CF_3(CH_2)_2SiCl_3$; $CF_3(CF_2)_5(CH_2)_2SiCl_3$; $CF_3(CF_2)_7(CH_2)_2Si(OCH_3)_3$; $CF_3(CF_2)_5(CH_2)_2Si(OCH_3)_3$; $CF_3(CF_2)_7(CH_2)_2SiCl_3$; $CF_3(CF_2)_7(CH_2)_2SiCH_3Cl_2$; and/or $CF_3(CF_2)_7(CH_2)_2SiCH_3(OCH_3)_2$. These FAS material may be used either alone or in any suitable combination for layer 6. At least partial hydrolysate (hydrolysed) versions of any of these compounds may also be used. Moreover, it is noted that this list of exemplary FAS materials is not intended to be limiting, as other FAS type materials may also be used in layer 6. While FAS inclusive layer 6 is applied over layer 3 by physical rubbing (or buffing) in certain preferred embodiments of this invention, layer 6 could instead be applied in any other suitable manner in other embodiments of this invention.

According to certain embodiments of this invention, while layers 2 and 3 each include DLC, the two layers are preferably deposited using different precursor or feedstock gases so that the two layers have different characteristics (e.g., different hardnesses and/or densities). In an exemplary embodiment, underlying or anchor DLC inclusive layer 2 is deposited using an ion beam deposition technique utilizing a TMS (tetramethylsilane) inclusive precursor or feedstock gas; while overlying DLC inclusive layer 3 is deposited using an ion beam deposition technique utilizing a $C_2H_2$ (acetylene) inclusive precursor or feedstock gas. It is believed that the underlying layer 2 (a silicon doped DLC alloy) deposited using TMS functions as a barrier layer to prevent certain impurities from getting into or out of the substrate. Moreover, when TMS is used in the deposition process of underlying anchor layer 2, the Si (silicon) in layer 2 helps to enable overlying DLC inclusive layer 3 to better bond and/or adhere to the glass via anchor layer 2.

Surprisingly, it has also been found that the use of anchor layer 2 (e.g., deposited via TMS gas) provides a more continuous/contiguous coating on a glass surface at very thin thicknesses as compared to a DLC inclusive layer deposited using $C_2H_2$ (acetylene) gas directly on glass. As a result, anchor layer 2 can be deposited first directly on the glass at a relatively thin thickness, and the overlying layer 3 need not be as thick as would otherwise be required. In general, the thinner the layer 3, the higher the transmission of the overall coating system. Moreover, the provision of anchor layer 2 may enable improved yields to be achieved, as the occurrence of pinholes in the coating system is less likely.

In embodiments where DLC inclusive layer 3 is formed on the substrate using a $C_2H_2$ (acetylene) inclusive precursor or feedstock gas and underlying DLC inclusive layer 2 is formed on the substrate using at least a TMS (tetramethylsilane) inclusive precursor or feedstock gas, the layers 2 and 3 tend to intermix with one another during the deposition process. Thus, there may not be a clear line delineating or separating the two layers 2 and 3 in the final product due to this intermixing (i.e., ion mixing) of the material from the two layers. However, for purposes of simplicity, the two layers 2 and 3 are referred to and illustrated herein as separate layers due to the different deposition processes (e.g., gases and/or energies) used in their respective formations.

It has been found that the outer DLC inclusive layer 3 formed using a hydrocarbon gas, such as $C_2H_2$ (acetylene), inclusive precursor or feedstock tends to have a greater hardness and density than does underlying DLC inclusive layer 2 formed using a TMS (tetramethylsilane) inclusive precursor or feedstock gas. For example, in certain exemplary embodiments of this invention, overlying layer 3 may have an average hardness (measured via a nano-indentation hardness measuring technique) of from about 45–85 GPa, more preferably from about 50–70 GPa, and most preferably from about 55–60 GPa. Meanwhile, underlying DLC inclusive layer 2 may have an average hardness of from about 10–35 GPa, and more preferably from about 15–30 GPa. Thus, the overlying layer 3 is harder than the underlying layer 2, so as to make the end product more scratch and/or abrasion resistant. Using a nano-indentation hardness measuring technique, the final coating system 5, including layers 2, 3 and 6, may have a hardness of at least about 10 GPa, more preferably from about 25–60 GPa, and even more preferably from about 30–45 GPa, which is at a hardness value between the respective hardnesses of the two DLC inclusive layers 2 and 3.

Thus, coating system 5 includes silicon (Si) and DLC inclusive layer 2 which functions to improve the bonding characteristics of overlying and harder DLC inclusive layer 3 to the substrate. While the Si in layer 2 improves the bonding of layer 3 to substrate 1, it is preferred that less Si be provided in layer 3 than in layer 2 because the provision of Si in a DLC inclusive layer may result in decreased scratch resistance and/or decreased hardness. Layer 3 may or may not include Si in different embodiments of this invention. While layer 2 allows for improved bonding to the substrate, the provision of DLC and some $sp^3$ carbon-carbon bonds therein allows this anchor layer 2 to have rather high hardness values so as to render the resulting product more durable and thus resistant to scratching, abrasions, and the like.

In embodiments where substrate 1 is of or includes glass (e.g., soda-lime-silica glass), anchor or intermediate DLC inclusive layer 2 may be from about 10 to 250 angstroms (Å) thick, more preferably from about 10 to 150 angstroms thick, and most preferably from about 30–50 angstroms thick; while outer DLC inclusive layer 3 may be from about 10 to 250 angstroms thick, more preferably from about 10 to 150 angstroms thick, and most preferably about 30–60 angstroms (Å) thick. FAS inclusive layer 6 may be from about 5–80 angstroms thick, more preferably from about 20–50 angstroms thick. However, these thicknesses are not limiting and the layers may be of other appropriate thicknesses in certain embodiments of this invention. Moreover, in embodiments where substrate 1 is of or includes plastic, layers 2, 3 and/or 6 may be of greater thickness(es) than those described above.

In certain embodiments, layer 3 may have an approximately uniform distribution of $sp^3$ carbon-carbon bonds throughout a large portion of its thickness, so that much of the layer has approximately the same density. In such embodiments, layer 2 may include a lesser percentage of $sp^3$ carbon-carbon bonds near the interface with substrate 1, with the percentage or ratio of $sp^3$ carbon-carbon bonds increasing throughout the thickness of the coating system 5 toward the outermost surface. In overlying DLC inclusive layer 3, at least about 40% (more preferably at least about 60%, and most preferably at least about 80%) of the carbon-carbon bonds in layer 3 are of the $sp^3$ carbon-carbon type.

It is believed that the presence of $sp^3$ carbon-carbon bonds in layer 3 increases the density and hardness of the coating system, thereby enabling it to satisfactorily function in automotive environments. Layer 3 may or may not include $sp^2$ carbon-carbon bonds in different embodiments, although formation of $sp^2$ carbon-carbon bonds is likely in both layers 2 and 3.

In order to improve the hydrophobic nature of coating system 5, atoms in addition to carbon (C) may be provided in at least overlying layer 3 in different amounts in different embodiments. For example, in certain embodiments of this invention layer 3 (taking the entire layer thickness, or only a thin 10 Å thick layer portion thereof into consideration) may include in addition to the carbon atoms of the $sp^3$ carbon-carbon bonds, by atomic percentage, from about 0–20% Si (more preferably from about 0–10%), from about 0–20% oxygen (O) (more preferably from about 0–15%), and from about 5–60% hydrogen (H) (more preferably from about 5–35% H). Optionally, layer 3 may include from about 0–10% (atomic percentage) fluorine (F) (more preferably from about 0–5% F) in order to further enhance hydrophobic characteristics of the coating. In general, the provision of H in layer 3 reduces the number of polar bonds at the coating's surface, thereby improving the coating system's hydrophobic properties.

In certain embodiments, the outermost layer portion (e.g., 5–15 angstrom thick outermost or exterior layer portion) of layer 3 may include additional H and/or F atoms for the purpose of increasing the coating system's hydrophobic qualities. In such embodiments, the deposition of additional H atoms near layer 3's surface results in a more passive or non-polar coating proximate the surface thereof.

Two exemplary coated articles were made and tested according to the FIG. 1 embodiment of this invention, as follows.

For the first coated article (sample #1), DLC inclusive layers 2 and 3 were deposited on a soda-lime-silica glass substrate 1 using a linear ion beam deposition source (see FIGS. 5–6) in the following manner. TMS feedstock gas (50 sccm) was used at 1,500 Volts to deposit layer 2, while $C_2H_2$ feedstock gas (100 sccm) was used at 3,000 Volts to deposit layer 3 directly on top of layer 2. The scan speed for each of these was 36–50 in./minute. Each of layers 2 and 3 was less than 50 angstroms thick (likely from about 20–50 angstroms thick). Sample #2 was made in the same manner as sample #1, except that 750 Volts were used in depositing layer 2 (the same 3,000 Volts were used for layer 3). Chart 1 below lists the measured characteristics of the substrates 1 coated with layers 2 and 3, prior to deposition of FAS layer 6, for sample #s 1 and 2 of the FIG. 1 embodiment.

CHART 1

| | Initial Contact Angle θ | Angle θ @ 25 Taber Cycles | @ 300 | @ 1,000 |
|---|---|---|---|---|
| #1 | 95° | 104° | 103° | 97° |
| #2 | 95° | 104° | N/A | 96° |

As can be seen in Chart 1 above, each of these coated articles (substrate with DLC inclusive layers 2 and 3 thereon, but no FAS layer) had an initial contact angle θ of about 95 degrees. After being subjected to 25 cycles of a Taber abrasion test, each had a contact angle of about 104 degrees, and after being subject to 1,000 cycles of the Taber abrasion test the articles had contact angles of 97 and 96 degrees, respectively.

An FAS layer 6 was then deposited on top of a layer 3 as shown in the FIG. 1 embodiment of this invention. Layer 6 was applied by physically rubbing layer 6 onto the exterior surface of layer 3. The measurements from this coated article (i.e., sample #3 including each of layers 2, 3 and 6 on soda-lime-silica glass substrate 1) are set forth below in Chart 2.

CHART 2

| | Initial Contact Angle θ | Angle θ @ 25 Taber Cycles | @ 300 | @ 1,000 |
|---|---|---|---|---|
| #3 | 109° | 106° | 100° | 95° |

As can be seen by comparing the results in Chart 2 (with FAS layer 6) to the results of Chart 1 (without FAS layer 6), the provision of FAS layer 6 improved at least the initial contact angle of the resulting coated article. Charts 1 and 2 show that the addition of FAS layer 6 resulted in the initial contact angle improving from about 95 degrees to about 109 degrees. Thus, hydrophobic properties of the article were improved with the addition of FAS inclusive layer 6.

Figure 1B:
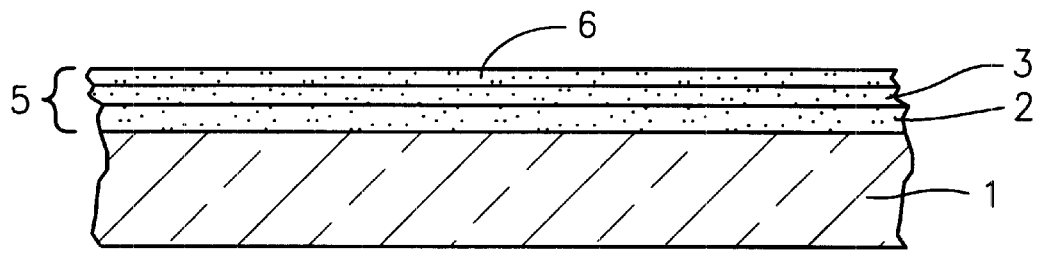
FIG. 1(b) is a side cross sectional view of a coated article according to an embodiment of this invention, wherein a substrate is provided with a DLC and FAS inclusive coating system thereon having hydrophobic qualities.
Figure 2:
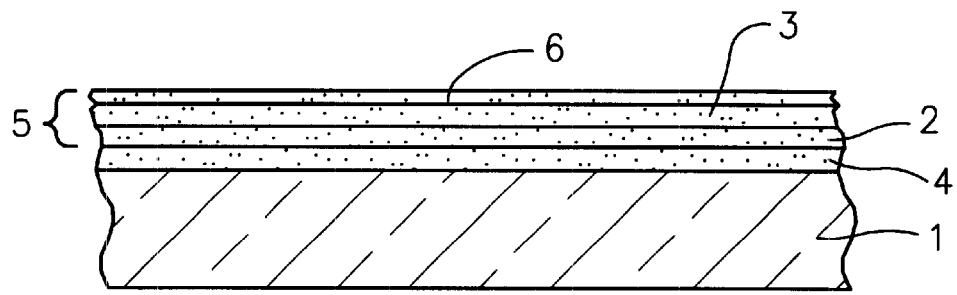
FIG. 2 is a side cross sectional view of a coated article according to another embodiment of this invention, wherein the DLC and FAS inclusive coating or coating system of FIG. 1(b) is provided over an intermediate layer(s).

FIG. 2 is a side cross sectional view of a coated article according to another embodiment of this invention, including substrate 1 (e.g. glass), hydrophobic DLC inclusive coating system 5 including layers 2, 3, and 6 as described above with regard to the FIG. 1 embodiment, and intermediate layer(s) 4 provided between layer 2 and substrate 1. Intermediate layer 4 may be of or include, for example, any of silicon nitride, silicon oxide, an infrared (IR) reflecting layer or layer system, an ultraviolet (UV) reflecting layer of layer system, another DLC inclusive layer(s), or any other type of desired layer(s). In this embodiment, it is noted that coating system 5 is still "on" substrate 1. The term "on" herein means that substrate 1 supports DLC coating system 5, regardless of whether or not other layer(s) (e.g. 4) are provided therebetween (this also applies to the term "over" herein). Thus, hydrophobic coating system 5 may be provided directly on substrate 1 as shown in FIG. 1, or may be provided on substrate 1 with another coating system or layer 4 therebetween as shown in FIG. 2.

Exemplar coatings/layers that may be used as low-E or other coating(s)/layer(s) 4 are shown and/or described in any of U.S. Pat. Nos. 5,837,108, 5,800,933, 5,770,321, 5,557, 462, 5,514,476, 5,425,861, 5,344,718, 5,376,455, 5,298,048, 5,242,560, 5,229,194, 5,188,887 and 4,960,645, which are all hereby incorporated herein by reference.

Figure 3:
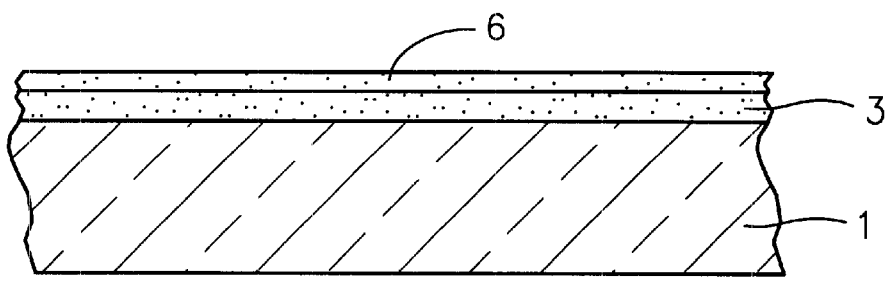
FIG. 3 is a side cross sectional view of a coated article including a DLC and FAS inclusive hydrophobic coating system according to another embodiment of this invention.

FIG. 3 illustrates another embodiment of this invention that is the same as the FIG. 1(b) embodiment, except that layer 2 is not provided. Thus, a single DLC inclusive layer 3 is provided under FAS inclusive layer 6 in the FIG. 3 embodiment. It has been found that DLC inclusive layer 2 need not be provided in all embodiments of this invention (i.e., DLC inclusive layer 2 is optional). In still further embodiments, one or more intermediate layer(s) 4 may be provided between layer 3 and substrate 1 in the FIG. 3 embodiment.

Referring to the different embodiments of FIGS. 1–3, coating system 5 (or the coating system of layers 3 and 6 in the FIG. 3 embodiment) is at least about 75% transparent to or transmissive of visible light rays, preferably at least about 85%, and most preferably at least about 95%.

When substrate 1 is of glass, it may be from about 1.0 to 5.0 mm thick, preferably from about 2.3 to 4.8 mm thick, and most preferably from about 3.7 to 4.8 mm thick. In certain embodiments, another advantage of coating system 5 is that the ta-C (e.g., in layers 2 and/or 3) therein may reduce the amount of soda (e.g., from a soda-lime-silica glass substrate 1) that can reach the surface of the coated article and cause stains/corrosion. In such embodiments, substrate 1 may be soda-lime-silica glass and include, on a weight basis, from about 60–80% $SiO_2$, from about 10–20% $Na_2O$, from about 0–16% CaO, from about 0–10% $K_2O$, from about 0–10% MgO, and from about 0–5% $Al_2O_3$. Iron and/or other additives may also be provided in the glass composition of the substrate 1. In certain other embodiments, substrate 1 may be soda lime silica glass including, on a weight basis, from about 66–75% $SiO_2$, from about 10–20% $Na_2O$, from about 5–15% CaO, from about 0–5% MgO, from about 0–5% $Al_2O_3$, and from about 0–5% $K_2O$. Most preferably, substrate 1 is soda lime silica glass including, by weight, from about 70–74% $SiO_2$, from about 12–16% $Na_2O$, from about 7–12% CaO, from about 3.5 to 4.5% MgO, from about 0 to 2.0% $Al_2O_3$, from about 0–5% $K_2O$, and from about 0.08 to 0.15% iron oxide. Soda lime silica glass according to any of the above embodiments may have a density of from about 150 to 160 pounds per cubic foot (preferably about 156), an average short term bending strength of from about 6,500 to 7,500 psi (preferably about 7,000 psi), a specific heat (0–100 degrees C.) of about 0.20 Btu/lbF, a softening point of from about 1330 to 1345 degrees F., a thermal conductivity of from about 0.52 to 0.57 Btu/hrftF, and a coefficient of linear expansion (room temperature to 350 degrees C.) of from about 4.7 to $5.0 \times 10^{-6}$ degrees F. Also, soda lime silica float glass available from Guardian Industries Corp., Auburn Hills, Mich., may be used as substrate 1. Any such aforesaid glass substrate 1 may be, for example, green, blue or grey in color when appropriate colorant(s) are provided in the glass in certain embodiments.

In certain other embodiments of this invention, substrate 1 may be of borosilicate glass, or of substantially transparent plastic, or alternatively of ceramic. In certain borosilicate embodiments, the substrate 1 may include from about 75–85% $SiO_2$, from about 0–5% $Na_2O$, from about 0 to 4% $Al_2O_3$, from about 0–5% $K_2O$, from about 8–15% $B_2O_3$, and from about 0–5% $Li_2O$.

In still further embodiments, an automotive window (e.g. windshield or side window) including any of the above glass substrates laminated to a plastic substrate may combine to make up substrate 1, with the coating system(s) of any of the FIGS. 1–3 embodiments provided on the outside surface of such a window. In other embodiments, substrate 1 may include first and second glass sheets of any of the above mentioned glass materials laminated to one another, for use in window (e.g. automotive windshield, residential window, commercial architectural window, automotive side window, vacuum IG window, automotive backlight or back window, etc.) and other similar environments.

When substrate 1 of any of the aforesaid materials is coated with at least a DLC and FAS inclusive coating system according to any of the FIGS. 1–3 embodiments, the resulting coated article has the following characteristics in certain embodiments: visible transmittance (Ill. A) greater than about 60% (preferably greater than about 70%, and most preferably greater than about 80%), UV (ultraviolet) transmittance less than about 38%, total solar transmittance less than about 45%, and IR (infrared) transmittance less than about 35% (preferably less than about 25%, and most preferably less than about 21%). Exemplary visible, "total solar", UV, and IR transmittance measuring techniques are set forth in U.S. Pat. No. 5,800,933, incorporated herein by reference.

Hydrophobic performance of the coating system of any of the FIGS. 1–3 embodiments is a function of contact angle θ, surface energy γ, tilt angle β, and/or wettability or adhesion energy W.

Figure 4A:
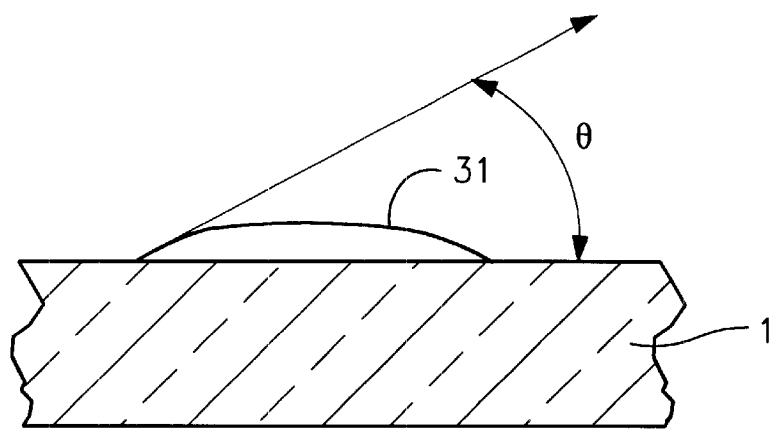
FIG. 4(a) is a side cross sectional partially schematic view illustrating a low contact angle θ of a water drop on a glass substrate.
Figure 4B:
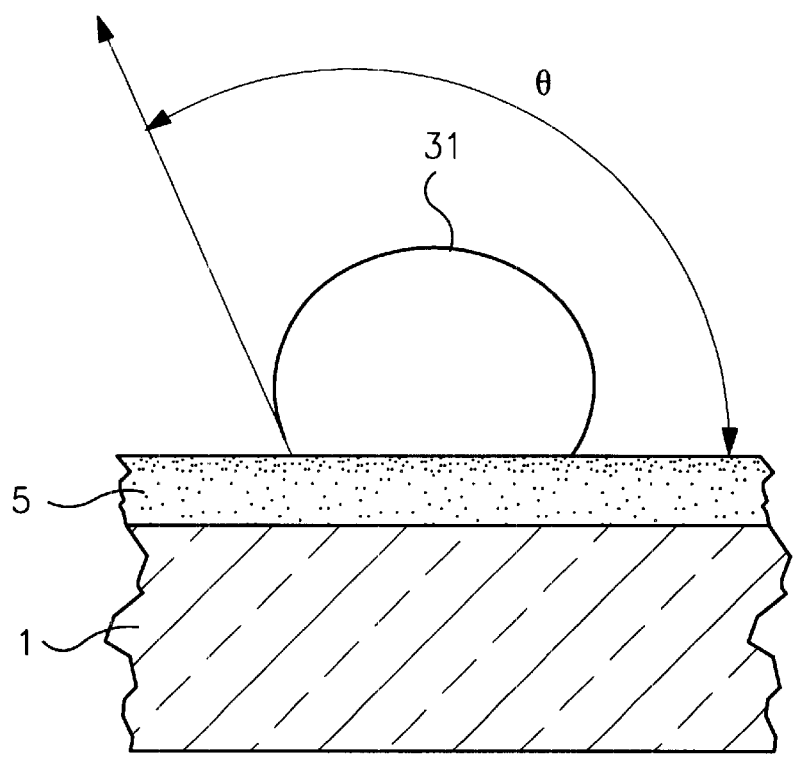
FIG. 4(b) is a side cross sectional partially schematic view illustrating the coated article of any of the FIGS. 1–3 embodiments of this invention and the contact angle θ of a water drop thereon.

The surface energy γ of a coating system may be calculated by measuring its contact angle θ (contact angle θ is illustrated in FIGS. 4(a) and 4(b)). FIG. 4(a) shows the contact angle of a drop on a substrate absent this invention, while FIG. 4(b) shows the contact angle of a drop on a substrate having a coating system thereon according to this invention. A sessile drop 31 of a liquid such as water is placed on the coating as shown in FIG. 4(b). A contact angle θ between the drop 31 and underlying coating system 5 appears, defining an angle depending upon the interface tension between the three phases in the point of contact. Generally, the surface energy $\gamma_C$ of a coating system can be determined by the addition of a polar and a dispersive component, as follows: $\gamma_C = \gamma_{CP} + \gamma_{CD}$, where $\gamma_{CP}$ is the coating's polar component and $\gamma_{CD}$ the coating's dispersive component. The polar component of the surface energy represents the interactions of the surface which is mainly based on dipoles, while the dispersive component represents, for example, van der Waals forces, based upon electronic interactions. Generally speaking, the lower the surface energy $\gamma_C$ of coating system 5, the more hydrophobic the coating and the higher the contact angle θ.

Adhesion energy (or wettability) W can be understood as an interaction between polar with polar, and dispersive with dispersive forces, between the coating system and a liquid thereon such as water. $\gamma^P$ is the product of the polar aspects of liquid tension and coating/substrate tension; while $\gamma^D$ is the product of the dispersive forces of liquid tension and coating/substrate tension. In other words, $\gamma^P = \gamma_{LP} * \gamma_{CP}$; and $\gamma^D = \gamma_{LD} * \gamma_{CD}$; where $\gamma_{LP}$ is the polar aspect of the liquid (e.g. water), $\gamma_{CP}$ is the polar aspect of coating system (e.g., coating system 5); $\gamma_{LD}$ is the dispersive aspect of liquid (e.g. water), and $\gamma_{CD}$ is the dispersive aspect of the coating system. It is noted that adhesion energy (or effective interactive energy) W, using the extended Fowkes equation, may be determined by:

$W = [\gamma_{LP} * \gamma_{CP}]^{1/2} + [\gamma_{LD} * \gamma_{CD}]^{1/2} = \gamma_1(1 + \cos\theta)$, where $\gamma_1$ is liquid tension and θ is the contact angle. W of two materials is a measure of wettability indicative of how hydrophobic the coating system is.

When analyzing the degree of hydrophobicity of outermost layer/portion of the coating system 5 with regard to water, it is noted that for water $\gamma_{LP}$ is 51 mN/m and $\gamma_{LD}$ is 22 mN/m. In certain embodiments of this invention, the polar aspect $\gamma_{CP}$ of surface energy of layers 3 and 6 is from about 0 to 0.2 (more preferably variable or tunable between 0 and 0.1) and the dispersive aspect $\gamma_{CD}$ of the surface energy of layers 3 and 6 is from about 16–22 mN/Nm (more preferably from about 16–20 mN/m). Using the above-listed numbers, according to certain embodiments of this invention, the surface energy $\gamma_C$ of layer 6 (or 3 in certain embodiments) (and thus coating system 5) is less than or equal to about 20.2 mN/m, more preferably less than or equal to about 19.5 mN/m, and most preferably less than or equal to about 18.0 mN/m; and the adhesion energy W between water and the coating system is less than about 25 mN/m, more preferably less than about 23 mN/m, even more preferably less than about 20 mN/m, and most preferably less than about 19 mN/m. These low values of adhesion energy W and the coating system's surface energy $\gamma_C$, and the high initial contact angles θ achievable, illustrate the improved hydrophobic nature of the coating systems 5 according to different embodiments of this invention. While layers 3 and 6 functions to provide much of the hydrophobic nature of the coating system 5, optional underlying DLC inclusive layer 2 improves the bonding characteristics of the coating system 5 to the substrate 1 (e.g., glass substrate) and yet still provides adequate hardness characteristics regarding the coating system 5 as a whole.

The initial contact angle θ of a conventional glass substrate 1 with sessile water drop 31 thereon is typically from about 22–24 degrees, although it may dip as low as 17 or so degrees in some circumstances, as illustrated in FIG. 4(a). Thus, conventional glass substrates are not particularly hydrophobic in nature. The provision of coating system 5 on substrate 1 causes the contact angle θ to increase to the angles discussed herein, as shown in FIG. 4(b) for example, thereby improving the hydrophobic nature of the article. As discussed in Table 1 of Ser. No. 09/303,548, the contact angle θ of a ta-C DLC layer is typically less than 50 degrees. However, the makeup of DLC-inclusive coating system 5 described herein enables the initial contact angle θ of the system relative to a water drop (i.e. sessile drop 31 of water) to be increased in certain embodiments to at least about 80 degrees, more preferably to at least about 100 degrees, even more preferably at least about 110 degrees, and most preferably at least about 125 degrees, thereby improving the hydrophobic characteristics of the DLC-inclusive coating system. An "initial" contact angle θ means prior to exposure to environmental conditions such as sun, rain, abrasions, humidity, etc.

Figure 5:
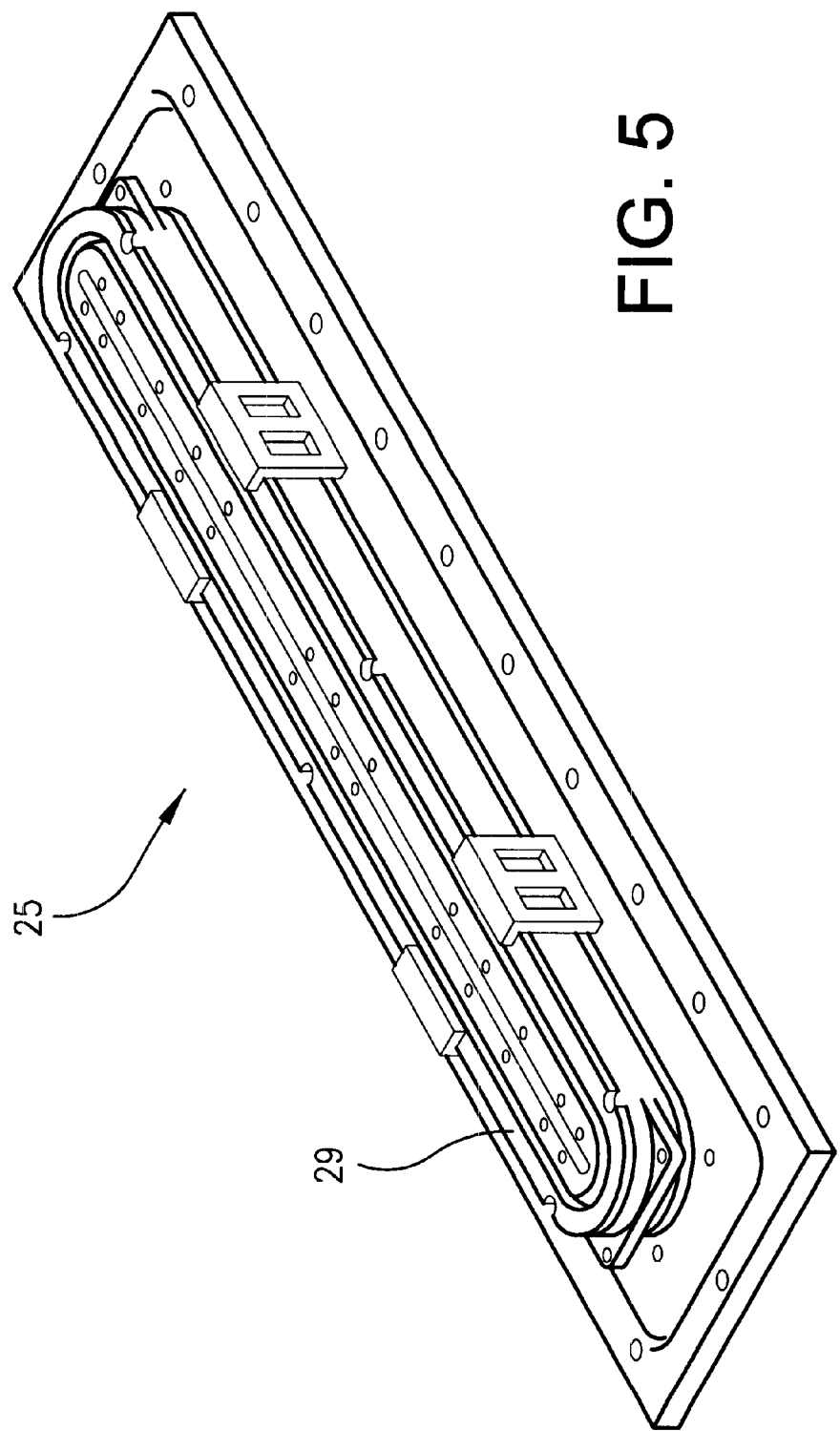
FIG. 5 is a perspective view of a linear ion beam source which may be used in any embodiment of this invention for depositing DLC inclusive layer(s).
Figure 6:
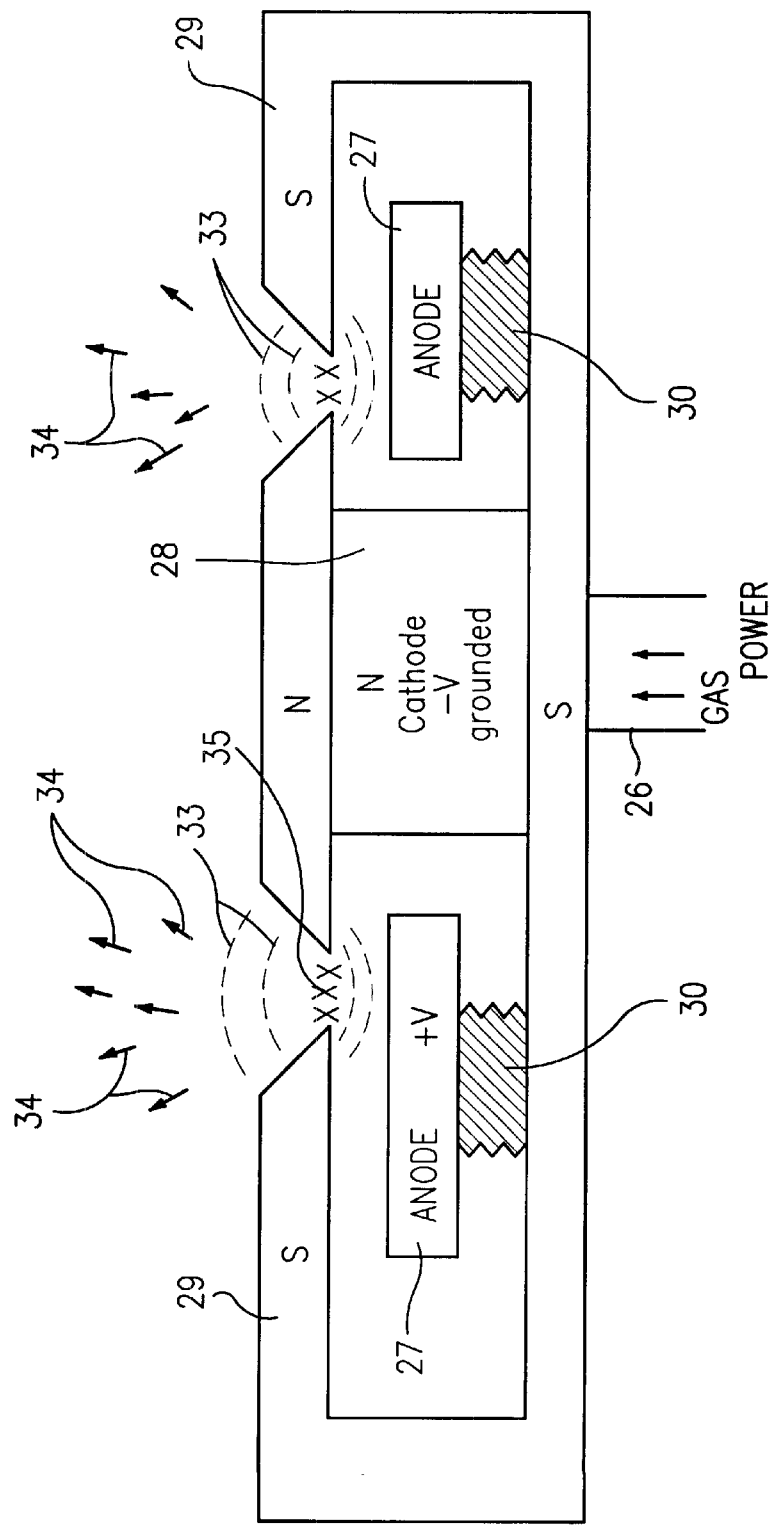
FIG. 6 is a cross sectional view of the linear ion beam source of FIG. 5.

FIGS. 5–6 illustrate an exemplary linear or direct ion beam source 25 which may be used to deposit layers 2 and 3 of coating system 5, clean a substrate, or surface plasma treat a DLC inclusive coating with H and/or F according to different embodiments of this invention. Ion beam source 25 includes gas/power inlet 26, anode 27, grounded cathode magnet portion 28, magnet poles 29, and insulators 30. A 3 kV DC power supply may be used for source 25 in some embodiments. Linear source ion deposition allows for substantially uniform deposition of layers 2 and 3 as to thickness and stoichiometry. As mentioned above, FAS inclusive layer 6 is preferably not applied using ion beam technology (rubbing/buffing is a preferred deposition technique for layer 6), although it may be formed in such a manner in certain embodiments of this invention.

Ion beam source 25 is based upon a known gridless ion source design. The linear source is composed of a linear shell (which is the cathode and grounded) inside of which lies a concentric anode (which is at a positive potential). This geometry of cathode-anode and magnetic field 33 gives rise to a close drift condition. The magnetic field configuration further gives rise to an anode layer that allows the linear ion beam source to work absent any electron emitter. The anode layer ion source can also work in a reactive mode (e.g. with oxygen and nitrogen). The source includes a metal housing with a slit in a shape of a race track as shown in FIGS. 5–6. The hollow housing is at ground potential. The anode electrode is situated within the cathode body (though electrically insulated) and is positioned just below the slit. The anode can be connected to a positive potential as high was 3,000 or more volts (V). Both electrodes may be water cooled in certain embodiments. Feedstock/precursor gases, described herein, are fed through the cavity between the anode and cathode. The gas(es) used determines the makeup of the resulting layer deposited on an adjacent substrate 1.

The linear ion source also contains a labyrinth system that distributes the precursor gas (e.g., TMS (i.e., $(CH_3)_4Si$ or tetramethylsilane); acetylene (i.e., $C_2H_2$); 3MS (i.e., trimethyldisilane); DMS (i.e., dichloro-dimethylsilane); HMDSO (i.e., hexamethyldisiloxane); TEOS (i.e., tetraethoxysilane), etc.) fairly evenly along its length and which allows it to supersonically expand between the anode-cathode space internally. The electrical energy then cracks the gas to produce a plasma within the source. The ions are expelled out at energies in the order of eVc-a/2 when the voltage is Vc-a. The ion beam emanating from the slit is approximately uniform in the longitudinal direction and has a Gaussian profile in the transverse direction. Exemplary ions 34 are shown in FIG. 6. A source as long as one meter may be made, although sources of different lengths are anticipated in different embodiments of this invention. Finally, electron layer 35 is shown in FIG. 6 completes the circuit thereby enabling the ion beam source to function properly.

In alternative embodiments of this invention, an ion beam source device or apparatus as described and shown in FIGS. 1–3 of U.S. Pat. No. 6,002,208 (hereby incorporated herein by reference in its entirety) may be used to deposit/form DLC inclusive layers 2 and 3 on substrate 1 in accordance with either the FIG. 1(b), FIG. 2, or FIG. 3 embodiment of this invention. One or multiple such ion beam source devices may be used.

In certain embodiments, the same ion beam source 25 may be used to deposit both of layers 2 and 3; one after the other. In other embodiments of this invention two separate ion beam sources may be provided, a first for depositing layer 2 on substrate 1 and the second for depositing layer 3 over layer 2. In certain embodiments, another ion beam source may be provided for initially cleaning the surface of substrate 1 prior to deposition of layers 2, 3. After layers 2 and 3 are deposited, FAS inclusive layer 6 is preferably applied thereon.

Figure 7:
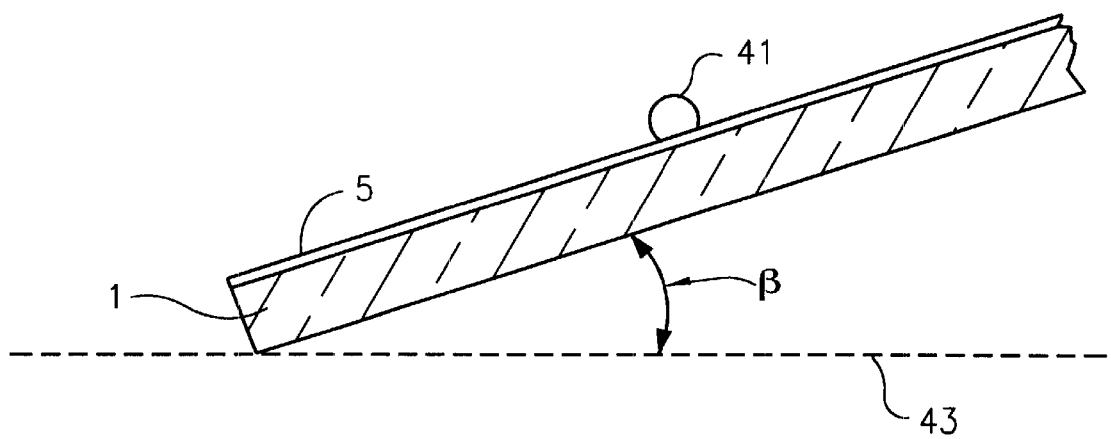
FIG. 7 is a diagram illustrating tilt angle as discussed herein in accordance with certain embodiments of this invention.

Referring to FIG. 7, tilt angle β characteristics associated with certain embodiments of this invention will be explained. In a hydrophobic coating, it is often desirable in certain embodiments to have a high contact angle θ (see FIG. 4(b)) in combination with a low tilt angle β. As shown in FIG. 7, tilt angle β is the angle relative to the horizontal 43 that the coated article must be tilted before a 30 μL (volume) drop 41 (e.g., of water) thereon begins to flow down the slant at room temperature without significant trail. A low tilt angle means that water and/or other liquids may be easily removed from the coated article upon tilting the same or even in high wind conditions. In certain embodiments of this invention, coated articles herein (with layers 2, 3 and 6) have an initial tilt angle β of no greater than about 30 degrees, more preferably no greater than about 20 degrees, and even more preferably no greater than about 10 degrees. In certain embodiments, the tilt angle does not significantly increase over time upon exposure to the environment and the like, while in other embodiments it may increase to some degree over time.

Referring to FIGS. 1 and 5–6, an exemplary method of depositing a coating system 5 on substrate 1 will now be described. This method is for purposes of example only, and is not intended to be limiting.

Prior to coating system 5 being formed on glass substrate 1, the top surface of substrate 1 may be cleaned by way of a first linear or direct ion beam source. For example, a glow discharge in argon (Ar) gas or mixtures of $Ar/O_2$ (alternatively $CF_4$ plasma) may be used to remove any impurities on the substrate surface. Such interactions are physio-chemical in nature. This cleaning creates free radicals on the substrate surface that subsequently can be reacted with other monomers yielding substrate surfaces with specialized properties. The power used may be from about 100–300 Watts. Substrate 1 may also be cleaned by, for example, sputter cleaning the substrate prior to actual deposition of coating system 5; using oxygen and/or carbon atoms at an ion energy of from about 800 to 1200 eV, most preferably about 1,000 eV.

After cleaning, the deposition process begins using a linear ion beam deposition technique via second ion beam source as shown in FIGS. 5–6, or in FIGS. 1–3 of the '208 patent; with a conveyor having moved the cleaned substrate 1 from first source to a position under the second source. The second ion beam source functions to deposit a DLC inclusive layer 2 on substrate 1, with at least TMS being used as the precursor or feedstock gas fed through the source. Because of the Si in the TMS gas used in the source, the resulting layer 2 formed on substrate includes at least Si as well as DLC. The Si portion of DLC inclusive layer 2 enables good bonding of layer 2 to substrate 1 (substrate 1 is glass in this example), and thus will also improve the bonding characteristics of layer 3 to the substrate via layer 2.

After layer 2 has been formed, either the same or another ion beam source is used to deposit layer 3 over (directly on in preferred embodiments) layer 2. To deposit overlying DLC inclusive layer 3, another gas such as at least $C_2H_2$ is fed through the source so that the source expels the ions necessary to form layer 3 overlying layer 2 on substrate 1. The $C_2H_2$ gas may be used alone, or in exemplary alternative embodiments the gas may be produced by bubbling a carrier gas (e.g. $C_2H_2$) through a precursor monomer (e.g. TMS or 3MS) held at about 70 degrees C. (well below the flashing point). Acetylene feedstock gas ($C_2H_2$) is used in certain embodiments for depositing layer 3 to prevent or minimize/reduce polymerization (layer 2 may be polymerized in certain embodiments) and to obtain an appropriate energy to allow the ions to penetrate the surface on the substrate/layer 2 and subimplant therein, thereby causing layer 3 to intermix with layer 2 in at least an interface portion between the layers. The actual gas flow may be controlled by a mass flow controller (MFC) which may be heated to about 70 degrees C. In certain optional embodiments, oxygen ($O_2$) gas may be independently flowed through an MFC. The temperature of substrate 1 may be room temperature; an arc power of about 1000 W may be used; precursor gas flow may be about 25 sccm; the base pressure may be about $10^{-6}$ Torr. The optimal ion energy window for the majority of layers 2, 3 is from about 100–1,000 eV (preferably from about 100–400 eV) per carbon ion. At these energies, the carbon in the resulting layers 2, 3 emulates diamond, and $sp^3$ C—C bonds form. However, compressive stresses can develop in ta-C when being deposited at 100–150 eV. Such stress can reach as high as 10 GPa and can potentially cause delamination from many substrates. It has been found that these stresses can be controlled and decreased by using an ion energy during the deposition process in a range of from about 200–1,000 eV.

As stated above, layers 2 and 3 intermix with one another at the interface between the two layers, thereby improving the bonding between the layers. At particle energies (carbon energies) of several hundred eV, a considerable material transport can take place over several atomic distances. This is caused by the penetration of fast ions and neutrals as well as by the recoil displacement of struck atoms. At sufficiently high particle energies and impact rates, there is an enhanced diffusion of the thermally agitated atoms near the film surface that occurs via the continuously produced vacancies. In the formation of ta-C:H, these effects can help improve film adhesion by broadening the interface (i.e., making it thicker, or making an interfacial layer between the two layers 2 and 3 (or between layer 2 and glass 1) due to atom mixing). After layer 2 is deposited, the carbon from layer 3 implants into layer 2 (i.e., subimplantation) so as to make the bond better of layer 3 to the substrate. Thus, layers 2 and 3 are contiguous due to this intermixing, and this "smearing" between the layers enhances the adhesion of layer 3 to both layer 2 and thus the substrate 1.

High stress is undesirable in the thin interfacing portion of layer 2 that directly contacts the surface of a glass substrate 1 in the FIG. 1 embodiment. Thus, for example, the first 1–40% thickness (preferably the first 1–20% and most preferably the first 5–10% thickness) of layer 2 may optionally be deposited on substrate 1 using high anti-stress energy levels of from about 200–1,000 eV, preferably from about 400–500 eV. Then, after this initial interfacing layer portion of layer 2 has been grown, the ion energy in the ion deposition process may be decreased (either quickly or gradually while deposition continues) to about 100–200 eV, preferably from about 100–150 eV, to grow the remainder of layer(s) 2 and/or layer 3. Thus, in certain embodiments, because of the adjustment in ion energy and/or gases during the deposition process, DLC inclusive layers 2, 3 may optionally have different densities and different percentages of $sp^3$ C—C bonds at different layer portions thereof (the lower the ion energy, the more $sp^3$ C—C bonds and the higher the density).

While direct ion beam deposition techniques are preferred in certain embodiments, other methods of deposition may also be used in different embodiments. For example, filtered cathodic vacuum arc ion beam techniques may be used to deposit layers 2, 3. Also, in certain embodiments, $CH_4$ may be used as a feedstock gas during the deposition process instead of or in combination with the aforesaid $C_2H_2$ gas.

Optionally, the outer surface of layer 3 may be treated using a plasma treatment by another source or grafting procedure (prior to formation of FAS layer 6). This technique using an ion beam source may remove certain polar functional groups at the outermost surface of layer 3, thereby altering the surface chemical reactivity (i.e. lowering surface energy) of layer 3. In such optional embodiments, after a conveyor has moved the DLC-coated substrate from the second source station to a position under this another source, the plasma treatment by this source may introduce, e.g., hydrogen (H) atoms into the outermost surface of layer 3, thereby making layer 3's surface substantially non-polar and less dense than the rest of layer 3. These H atoms are introduced, because $H_2$ and/or $ArH_2$ feedstock gas is used by this source in certain embodiments. Thus, this source does not deposit any significant amounts of C atoms or Si atoms; but instead treats the outermost surface of layer 3 by adding H atoms thereto in order to improve its hydrophobic characteristics. This plasma treatment may also function to roughen the otherwise smooth surface. It is noted that $H_2$ feedstock gas is preferred in the ion beam source when it is not desired to roughen the surface of coating system 5, while $ArH_2$ feedstock gas is preferred in surface roughing embodiments. In other optional embodiments, this source may be used to implant F ions/atoms in to the outermost surface of layer 3.

After DLC inclusive layers 2 and 3 have been formed on substrate 1, FAS inclusive layer 6 is deposited thereon or applied thereto as shown in FIG. 1 (e.g., by rubbing or otherwise applying/depositing this layer 6 in any other suitable manner).

After FAS inclusive layer 6 has been formed on the substrate 1, the coated article is heated (e.g., at about 70–120 degrees C., or any other temperature mentioned above) for a period of time sufficient to achieve one or more of the advantages discussed above (see step 13 in FIG. 1(*a*)). Surprisingly, as mentioned previously, it has been found that heating the coated article in such a manner improves the durability of FAS inclusive layer 6, and thus of the overall coating system. It is thought that such hearing may "cure" layer 6 or otherwise cause it to more completely bond to itself and/or layer 3.

Coating system 5 according to different embodiments of this invention may have the following characteristics: coefficient of friction of from about 0.02 to 0.15; good abrasion resistance; an average density of from about 2.0 to 3.0 g/cm$^2$; permeability barrier to gases and ions; surface roughness less than about 0.5 nm; inert reactivity to acids, alkalis, solvents, salts and water; corrosion resistance; variable or tunable surface tension; tunable optical bandgap of from about 2.0 to 3.7 eV; IR transmission@10 µm of at least about 85%; UV transmission@350 nm of no greater than about 30%; tunable refractive index@550 nm [n=1.6 to 2.3; k=0.0001 to 0.1], permittivity@GHz 4.5; an undoped electrical resistivity of at least about $10^{10}$ Ω/cm; dielectric constant of about 11@10 kHz and 4@100 MHz; an electrical breakdown strength (V cm$^{-1}$) of about $10^6$; thermal coefficient of expansion of about $9 \times 10^{-6}$/C.; and thermal conductivity of about 0.1 Wcm K.

Three examples of optional TMS-formed DLC inclusive anchor layers 2 are as follows. Each such layer 2 was deposited on substrate 1 using tetramethylsilane (TMS) and O$_2$ gas introduced within the linear ion beam source apparatus of FIGS. 5–6. All samples were of approximately the same thickness of about 750 Å. A low energy electron flood gun was used to sharpen the spectral analysis conducted by x-ray photo electron spectroscopy (XPS) for chemical analysis. In XPS analysis of a layer 2, high energy x-ray photons (monochromatic) impinge on the surface of the layer. Electrons from the surface are ejected and their energy and number (count) measured. With these measurements, one can deduce the electron binding energy. From the binding energy, one can determine three things: elemental fingerprinting, relative quantity of elements, and the chemical state of the elements (i.e. how they are bonding). Components used in the XPS analysis include the monochromatic x-ray source, an electron energy analyzer, and electron flood gun to prevent samples from charging up, and an ion source used to clean and depth profile. Photoelectrons are collected from the entire XPS field simultaneously, and using a combination of lenses before and after the energy analyzer are energy filtered and brought to a channel plate. The result is parallel imaging in real time images. Sample Nos. 1–3 of DLC inclusive layer 2 were made and analyzed using XPS, which indicated that the samples included the following chemical elements by atomic percentage (H was excluded from the chart below).

CHART 3

| Sample No. | C | O | Si | F |
|---|---|---|---|---|
| 1 | 54.6% | 23.7% | 20.5% | 1.2% |
| 2 | 45.7% | 21.7% | 32.7% | 0% |
| 3 | 59.5% | 22.7% | 17.8% | 0% |

H was excluded from the XPS analysis because of its difficulty to measure. Thus, H atoms present in the coating Sample Nos. 1–3 of Chart 3 were not taken into consideration for these results. For example, if Sample No. 1 in Chart 3 included 9% H by atomic percentage, then the atomic percentages of each of the above-listed elements C, O, Si and F would be reduced by an amount so that all five atomic percentages totaled 100%. As can be seen, F is optional and need not be provided. Oxygen is also optional.

While TMS is described above as a primary precursor or feedstock gas utilized in the ion beam deposition source for depositing the optional underlying DLC inclusive layer 2, other gases may in addition or instead be used. For example, other gases such as the following may be used either alone, or in combination with TMS, to form layer 2: silane compounds such as TMS, diethylsilane, TEOS, dichlorodimethylsilane, trimethyldisilane, hexamethyldisiloxane, organosilane compounds; organosilazane compounds such as hexamethyldisilazane and tetramethyldisilazane; and/or organo-oxysilicon compounds such as tetramethyldisiloxane, ethoxytrimethylsilane, and organo-oxysilicon compounds. Each of these gases includes Si; and each of these gases may be used either alone to form layer 2, or in combination with one or more of the other listed gases. In certain embodiments, the precursor gas may also further include N, F and/or O in optional embodiments, for layer 2 and/or layer 3.

With regard to layer 3, a hydrocarbon gas such as acetylene is preferred for forming the layer. However, other gases such as ethane, methane, butane, cyclohexane, and/or mixtures thereof may also (or instead) be used in the ion beam source to form layer 3.

In certain embodiments of this invention (e.g., see FIGS. 1–3), coating system 5 has a contact angle of at least about 70°, more preferably at least about 80°, and even more preferably at least about 100° after a taber abrasion resistance test has been performed pursuant to ANSI Z26. 1. The test utilizes 1,000 rubbing cycles of coating system 5, with a load a specified in Z26.1 on the wheel(s). Another purpose of this abrasion resistance test is to determine whether the coated article is resistive to abrasion (e.g. whether hazing is less than 4% afterwards). ANSI Z26.1 is hereby incorporated into this application by reference.

Figure 10:
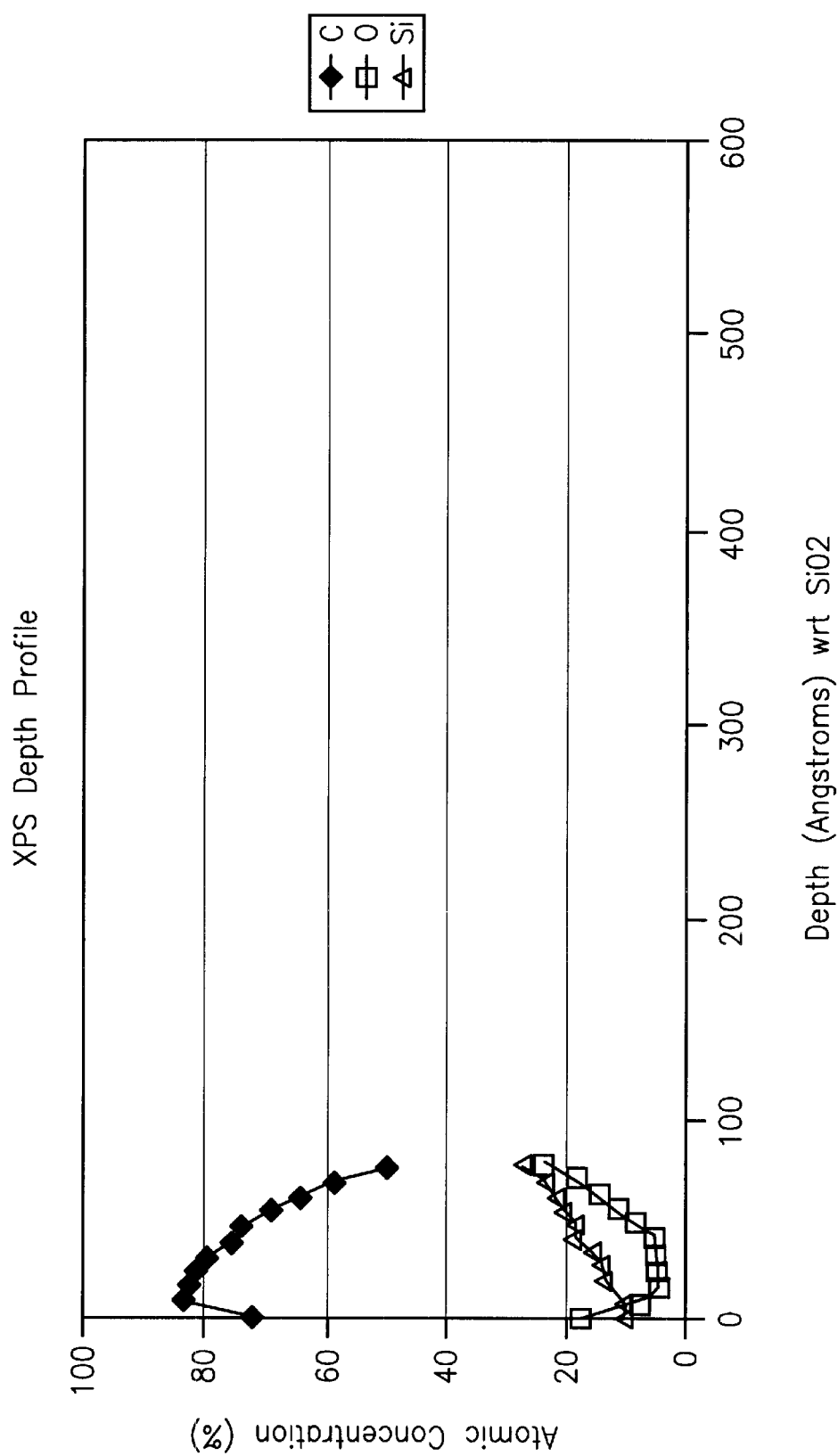
FIG. 10 is a thickness vs. atomic concentration graph illustrating the different amounts of the materials of FIG. 9 as a function of depth into the coating system of the FAS of FIG. 9.

FIGS. 8–10 illustrate the makeup of a coating system 5 including layers 2, 3 and 6 according to an embodiment of this invention. However, FIGS. 8 and 9 must be looked at together to span the entire coating system of layers 2, 3 and 6. FIG. 8 shows the make-up with regard to C, O and Si for layers 2 and 3, while FIG. 9 shows the make-up with regard to C, O and Si for layer 6, throughout the respective thicknesses of these layers. X-ray Photoelectron Spectroscopy (XPS)/Electron Spectroscopy for Chemical Analysis (ESCA) was used to develop these graphs from sample products. This is used to characterize inorganic and organic solid materials. In order to perform such measurements on sample products as was done with regard to FIGS. 8–10, surfaces of the coating system were excited with Al monochromatic x-rays (1486.6 eV) and the photoelectrons ejected from the surface were energy analyzed. Low resolution analysis, i.e., a survey scan, can be used to identify elements (note that H, He, and F were not included in the analysis of FIGS. 8–10 even though at least H and/or F were present in the coating system 5) and establish the illustrated concentration table in units of atomic percentage (%). Detection limits were from about 0.1 to 0.05 atom %. High resolution analysis of individual photoelectron signals, i.e., C 1s, can be used to identify chemical bonding and/or oxidation state. Information on the surface is obtained from a lateral dimension as large as 1 mm diameter and from a depth of 0–10 µm. To acquire information from slightly greater depths, angle resolved measurements can be made.

FIG. 8 illustrates the makeup with regard to C, O and Si throughout the thicknesses of DLC inclusive layers 2 and 3 of coating system 5 of the FIG. 1 embodiment (i.e., no FAS layer was on layers 2 and 3 when this data was measured). Cycle number 1 is at the outer surface of layer 3, while cycle number 19 is believed to be within the underlying glass substrate 1. Thus, it is believed that the interface between glass substrate 1 and underlying DLC inclusive layer 2 is at about cycle number 15 where the C % begins to significantly decrease. The "time" and "depth" columns refers to depth into layers 3, 2 from the exterior surface of layer 3 as compared to the depth into a conventional $SiO_2$ that would be achieved over the same time period. Thus, the angstrom depth illustrated in FIG. 8 is not the actual depth into layers 3, 2, but instead is how deep into a $SiO_2$ layer the sputtering would reach over the corresponding time. In FIG. 8, cycle number 1 may be affected from contamination of the outer surface of layer 3 and may be disregarded in effect. At least cycle numbers 2–6 refer or correspond to DLC inclusive layer 3 as evidenced by the high carbon amounts (i.e., greater than 94% C in layer 3 according to FIG. 8). Meanwhile, at least cycle numbers 9–13 refer or correspond to underlying DLC inclusive layer 2, as evidence by the lower C amounts shown in FIG. 8. Thus, it can be seen that layer 2 includes less C than layer 3, and is therefor less dense and less hard. Moreover, it can be seen that layer 2 includes more Si than layer 3 (and optionally more oxygen (O)). Cycle numbers 7–8 refer or correspond to the interface or intermixing layer portion between layers 2 and 3; as the coating system 5 at these thickness portions includes C and Si amounts between the amounts in respective layers 2 and 3. Thus, these cycle numbers 7–8 illustrate the intermixing (i.e., subimplantation of atoms from layer 3 in layer 2) or smearing between layers 2, 3 discussed herein. Meanwhile, cycle numbers 14–15 refer or correspond to the interfacial layer between layer 2 and the glass substrate 1, while cycle numbers 16–19 refer or correspond to the glass itself with its high $SiO_2$ content.

FIG. 9 illustrates a similar make-up, but of FAS layer 6 (i.e., with regard to only C, O and Si throughout the thickness of layer 6). The layer 6 analyzed in FIGS. 9–10 was of the $CF_3(CH_2)_2Si(OCH_3)_3$ type of FAS. Cycle number 1 is at the exterior surface of layer 6 where layer 6 meets the surrounding atmosphere, while cycle number 11 is believed to be in layer 6 near where the layer 6 meets the exterior surface of DLC inclusive layer 3. As can be seen by comparing FIGS. 8 and 9, the FAS inclusive layer 6 has much less carbon than does layer 3. FIG. 10 is a graph illustrating the results of FIG. 9 (absent the make-up of layers 2 and 3).

As will be appreciated by those skilled in the art, coated articles according to different embodiments of this invention may be utilized in the context of automotive windshields, automotive side windows, automotive backlites (i.e., rear windows), architectural windows, residential windows, ceramic tiles, shower doors, and the like.

Once given the above disclosure, many other features, modifications, and improvements will become apparent to the skilled artisan. Such other features, modifications, and improvements are, therefore, considered to be a part of this invention, the scope of which is to be determined by the following claims.

What is claimed is:

1. A method of making a coated article comprising:
   providing a substrate;
   forming a coating system on the substrate so that the coating system includes each of diamond-like carbon (DLC) and at least one fluoro-alkyl silane (FAS) compound; and
   heating at least an FAS compound portion on the coating system to a temperature and for a period of time sufficient to increase an initial contact angle θ of the resulting coated article.

2. The method of claim 1, wherein said heating comprises heating at least the FAS compound portion of the coating system to a temperature of from about 50 to 300 degrees C. for a period of time of from about 20 seconds to 2 hours.

3. The method of claim 2, wherein said heating comprises heating at least the FAS compound portion of the coating system to a temperature of from about 70 to 200 degrees C. for said period of time.

4. The method of claim 1, wherein the coating system includes at least one diamond-like carbon (DLC) inclusive layer and at least one fluoro-alkyl silane (FAS) compound inclusive layer, and wherein the coating system has an initial contact angle θ of at least about 80 degrees, and an average hardness of at least about 10 GPa.

5. The method of claim 4, wherein the FAS inclusive layer is located directly on the DLC inclusive layer so that the two layers are in contact with one another.

6. A method of making a coated article comprising:
   providing a substrate;
   forming a coating system on the substrate so that the coating system includes at least one diamond-like carbon (DLC) inclusive layer and at least one fluoro-alkyl silane (FAS) inclusive layer; and
   heating at least the FAS inclusive layer of the coating system to a temperature and for a period of time sufficient to improve contact angle θ stability of the resulting coated article.

7. The method of claim 6, wherein said heating comprises heating at least the FAS inclusive layer of the coating system to a temperature of from about 50 to 300 degrees C. for a period of time of from about 20 seconds to 2 hours.

8. The method of claim 7, wherein said heating comprises heating at least the FAS inclusive layer of the coating system to a temperature of from about 70 to 200 degrees C. for said period of time.

9. The method of claim 6, wherein the coating system has an initial contact angle θ of at least about 80 degrees, and an average hardness of at least about 10 GPa.

10. The method of claim 6, wherein the FAS includes at least one of: $CF_3(CH_2)_2Si(OCH_3)_3$; $CF_3(CF_2)_5(CH_2)_2Si(OCH_2CH_3)_3$; $CF_3(CH_2)_2SiCl_3$; $CF_3(CF_2)_5(CH_2)_2SiCl_3$; $CF_3(CF_2)_7(CH_2)_2Si(OCH_3)_3$; $CF_3(CF_2)_5(CH_2)_2Si(OCH_3)_3$; $CF_3(CF_2)_7(CH_2)_2SiCl_3$; $CF_3(CF_2)_7(CH_2)_2SiCH_3Cl_2$; and $CF_3(CF_2)_7(CH_2)_2SiCH_3(OCH_3)_2$.

11. A method of making a coated article comprising:
    providing a substrate;
    forming a coating system on the substrate so that the coating system includes each of diamond-like carbon (DLC) and at least one fluoro-alkyl silane (FAS) compound; and
    heating at least an FAS compound portion of the coating system to a temperature of from about 50 to 300 degrees C.

12. The method of claim 11, wherein said heating includes heating at least an FAS compound portion of the coating system for a period of time of from about 20 seconds to 2 hours.

13. The method of claim 12, wherein said heating comprises heating at least an FAS compound portion of the coating system to a temperature of from about 70 to 200 degrees C. for said period of time.

14. The method of claim 11, wherein the coating system includes at least one diamond-like carbon (DLC) inclusive layer and at least one fluoro-alkyl silane (FAS) compound inclusive layer, and wherein the coating system has an initial contact angle θ of at least about 80 degrees, and an average hardness of at least about 10 GPa.

15. The method of claim 14, wherein the FAS inclusive layer is located directly on the DLC inclusive layer so that the two layers are in contact with one another.

16. The method of claim 11, where said heating step comprises heating the entire coated article to a temperature of from about 50 to 300 degrees C.

17. The method of claim 11, wherein said FAS compound includes at least one of: $CF_3(CH_2)_2Si(OCH_3)_3$; $CF_3(CF_2)_5(CH_2)_2Si(OCH_2CH_3)_3$; $CF_3(CH_2)_2SiCl_3$; $CF_3(CF_2)_5(CH_2)_2SiCl_3$; $CF_3(CF_2)_7(CH_2)_2Si(OCH_3)_3$; $CF_3(CF_2)_5(CH_2)_2Si(OCH_3)_3$; $CF_3(CF_2)_7(CH_2)_2SiCl_3$; $CF_3(CF_2)_7(CH_2)_2SiCH_3Cl_2$; and $CF_3(CF_2)_7(CH_2)_2SiCH_3(OCH_3)_2$.

* * * * *